United States Patent [19]
Ward et al.

[11] Patent Number: 5,258,665
[45] Date of Patent: Nov. 2, 1993

[54] AC MILLER-KILLER CIRCUIT FOR L→Z TRANSITIONS

[75] Inventors: Michael G. Ward, Saco; Roy L. Yarbrough, Hiram, both of Me.

[73] Assignee: National Semiconductor Corporation, Santa Clara, Calif.

[21] Appl. No.: 881,540

[22] Filed: May 12, 1992

[51] Int. Cl.$^5$ ................................ H03K 19/01; H03K 19/08
[52] U.S. Cl. .................................... 307/443; 307/300; 307/446; 307/473
[58] Field of Search .............. 307/300, 443, 446, 473, 307/456, 570

[56] References Cited

U.S. PATENT DOCUMENTS

| | | | |
|---|---|---|---|
| 4,311,927 | 1/1982 | Ferris | 307/473 |
| 4,321,490 | 3/1982 | Bechdolt | 307/443 |
| 4,339,676 | 7/1982 | Ramsey | 307/473 |
| 4,572,970 | 2/1986 | Allen et al. | 307/473 |
| 4,839,537 | 6/1989 | Ueno | 307/446 |
| 4,996,449 | 2/1991 | Ueno | 307/446 |
| 5,118,974 | 6/1992 | Yarbrough et al. | 307/456 |
| 5,153,456 | 10/1992 | Keown | 307/456 |

*Primary Examiner*—Edward P. Westin
*Assistant Examiner*—Benjamin D. Driscoll
*Attorney, Agent, or Firm*—Thomas L. Bohan; Richard C. Calderwood

[57] ABSTRACT

A circuit to be used with tristate output buffers as a means of diverting from the output pulldown transistor control nodes Miller Current arising while the output buffer is being switched from the low-active state L to the inactive state Z. The circuit complements a DC Miller Killer circuit, relieving the latter from having to deal with this transient, and hence permitting a downsizing of the DCMK transistor. The net effect is a significantly faster L→Z transition for the tristate buffer and a slightly faster Z→L transition, all accomplished without degrading the DC Miller Killer protection against L→H bus transitions.

The key to the present invention is its use of the time interval between the respective, sequential switching of the enable buffer outputs, E and EB following the application of a disable signal to this enable buffer. The present invention includes circuitry which ensures that its Miller Killer transistor is conducting only during the transient associated with the L→Z switching. One embodiment for accomplishing this is to connect the control node of an "LZ/ACMK" transistor to the high-potential power rail through two control transistors wired in series. Then, by arranging the circuitry so that both control transistors are conducting only when E and EB are both logic-low, a situation which arises only in the midst of a transition of the output buffer into its Z state, the desired AC operation of the present Miller Killer is achieved.

11 Claims, 3 Drawing Sheets

2

AC MILLER-KILLER CIRCUIT FOR L→Z TRANSITIONS

BACKGROUND OF THE INVENTION

1. Field of the Invention

The present invention relates to tristate output buffers used to couple logic circuits to a common bus. A particular such buffer can exist: 1) in an active-high state (H) which causes it to present a logic-high-current sourcing-output to the bus; 2) in an active-low state (L) which causes it to present a logic-low-current sinking-output to the bus; 3) in an inactive state (Z) which causes it to present a high-impedance output to the bus. Buffer switching between active and inactive modes is achieved by an enable buffer circuit which couples into the tristate buffer's enable/disable gates E and EB.

The invention is related in particular to means for ensuring high speed switching of such buffers and in particular for preventing that power-draining, switch-delaying transient where a buffer's pulldown (current-sinking) circuitry is activated at the wrong time. More particularly, the present invention is one of the category of subcircuits introduced to ensure that a tristate buffer's pulldown transistor is subject neither to spurious turn-ons nor to delays in turning off. Signals inducing such spurious effects are often referred to as parasitic currents or Miller Currents and the curative subcircuits as "Miller Killers."

Even more particularly, the present invention relates to a subcircuit designed to kill the parasitic current arising as the buffer is switched from its L state to its Z state (the L→Z transition). Still more particularly, the present invention is a subcircuit designed to accelerate pulldown transistor turn-off during an L→Z transition, by furnishing a fast discharge path for that pulldown transistor's control node during the transition and only during the transition. In the invention's preferred embodiment, a bipolar junction transistor coupling that control node to ground is turned on during the L→Z transition transient so as to provide a discharge path (for that control node) that is of much lower impedance and much faster than those previously available. This fast discharge shunt not only quickly lowers the control node voltage of the pulldown transistor; it also allows a reduction in size of one of the existing Miller Killer transistors and thus speeds up the output buffer's Z→L transition as well as its L→Z transition. Because it operates just during a transient the present invention is an AC Miller Killer; because it is in particular the L→Z transient during which it operates, it can be designated an LZ/ACMK.

2. Description of Prior Art

The designation "Miller Current" shall be understood here to refer to all parasitic currents arising because of unwanted transient voltages appearing at the control node of an output pulldown transistor, regardless of whether the pulldown transistor is bipolar (BJT) or field effect (MOS). In the discussion below, it will be assumed that in general many tristate output buffers are connected to a common bus. In referring to effects in a particular buffer arising from signals appearing on the bus (due to other buffers), the buffer of interest will be referred to sometimes as the "local buffer."

Transitions giving rise to Miller Currents in tristate output buffers include 1) a buffer transition from active-low to active-high (L→H); 2) a bus transition from low to high (L→H) when the local buffer is in its inactive (Z) state; 3) a bus transition from low to high (L→H) when the local buffer is not powered up; 4) a buffer transition from active-low to inactive (L→Z). As stated, it is to the last problem that the present invention is addressed.

In each type of transition cited above, the Miller Current problem has been attacked by providing a low-impedance path directly to ground from the control node of the pulldown transistor, a low-impedance path which usually is activated when needed and otherwise de-activated during the periods it could degrade the buffer's performance characteristics. This switchable path to ground has generally been provided by a transistor (an MK transistor) which is turned on and off through circuitry coupled into the rest of the ouput buffer. Because of the variety of circumstances under which MK circuits are required, a particular output buffer may have a multiplicity of MK transistors, each being turned on during a distinct interval or switching sequence.

The earliest-issued MK patent is that of Bechdolt, U.S. Pat. No. 4,321,490 (1982): "Transistor Logic Output for Reduced Power Consumption and increased Speed During Low to High Transition." Bechdolt discloses an MK circuit dealing with the L→H transition of the local output buffer. In its low-active state (L) just prior to the L→H transition, the buffer is sinking current through its pulldown transistor(s). The L→H switching involves turning on the buffer's pullup transistors (so that they can "source" current to the common bus via $V_{OUT}$) and turning off the pulldown transistors so that they block. Ideally, the pulldown transistors will be turned off precisely as the pullup transistors turn on. Unfortunately, the latter tend to turn on before the former are turned off, resulting in a short interval during which both circuits are conducting, thereby connecting the high-potential power rail $V_{CC}$ directly to the low-potential power rail GND. This problem arises because of delays in the pulldown transistor turn-off, including the time required to charge the capacitors comprising the pulldown transistor's junctions, the change current being supplied by the pullup transistors. In addition, the ac voltage spike imposed on $V_{OUT}$ by the pullup circuit also appears at the collector of the pulldown transistor, where it is shunted across the associated Schottky diode to the base of that transistor where it can provide sufficient base drive to delay the turn-off of the pulldown transistor, or even to turn it on. The result is a significant power drain and prolongation of the time required for the buffer to complete the L→H transition. The curative MK circuit of Bechdolt comprises in significant part a bipolar transistor coupled between the base of the pulldown transistor and GND. The base node of this Miller Killer transistor is coupled to $V_{OUT}$ through a capacitor which is sufficiently large to pass the voltage/current spike imposed on $V_{OUT}$ by the pullup transistor(s) during the L→H transition but is otherwise blocking. The result is that during the L→H transition the MK transistor receives base drive current and becomes conducting, pulling the base of the pulldown transistor toward GND, hence ensuring its fast turn-off. I.e., the same L→H output transition which causes Miller Current also turns on the MK transistor which in turn pulls the base of the pulldown transistor toward GND, thus ensuring that the turn-off of that transistor is not delayed. Because it functions just during the transient, this circuit is an ACMK, the "AC"

referring to the MK transistor, which is activated just during the transient period. (It is of course crucial that the MK transistor not be conducting when the reverse transition (H→L) is called for, at which time full base drive must be applied quickly to the pulldown transistor.)

The MK circuit of Ferris, U.S. Pat. No. 4,311,927 (1982), "Transistor Logic Device with Reduced Output Capacitance," is directed at Miller Current generated at the output pulldown transistors of a local buffer in its inactive (Z) state during L→H switching of the bus. The problem arises because, even though the buffer is in its so-called "high Z" state, its large Miller Capacitance—including the contribution from the pulldown transistor's Schottky diode—provides a low ac impedance shunt to GND past the pulldown transistors' blocking junctions. Thus, forcing the output, $V_{OUT}$, of a Z-state local buffer high by an L→H transition of the common bus causes a significant parasitic current to flow. This not only loads the bus by itself, but also has the potential to provide base drive to the local buffer's pulldown transistors and thus to turn on that buffer's current-sinking circuit. These effects on the bus are multiplied by the number of inactive buffers connected to the bus and can cause a significant delay in the completion of the L→H bus transition and a significant power drain as well. As was the ACMK transistor, the MK transistor of Ferris is coupled between the base node of the output pulldown transitor and GND. The base of this MK transistor is coupled to the enable gate E in such a way that as long as the enable input at E is logic-high—placing the buffer in its inactive, high-Z (Z) state—the MK transistor is continuously on, providing a low impedance path to ground from the output pulldown transistor's control node. (To achieve this, two additional transistor—beyond the MK transistor itself—are included as intermediaries between the E input and the base node of the MK transistor.) Since the MK transistor of Ferris is maintained conducting throughout the time the buffer is in its Z state, it is called a dc Miller Killer (DCMK)—where the "DC" refers to the MK transistor, conducting continuously during the period that the buffer is in the Z state. Unlike the situation remedied by the ACMK, there is now no concern about the local buffer undergoing an H→L transition; it is in its inactive (Z) state. Subsequent developments of the DCMK are described in Vazehgoo, U.S. Pat. No. 4,649,297 (1987), "TTL Circuits for Generating Complementary Signals" and in Yarbrough et al., U.S. Pat. No. 5,051,623 (1991), "TTL Tristate Circuit for Output Pulldown Transistor."

The pending U.S. patent application of Ohannes et al., Ser. No. 07/803,201, addresses the case where a local buffer remains attached to the common bus through $V_{OUT}$ even though it is not powered up. The Ferris DCMK and subsequent variations depend upon the power available to the buffer from the high-potential power rail $V_{CC}$; when such power is absent the local buffer is not guarded against Miller Currents during an L→H bus transition. The "powered-down Miller Killer" (PDMK) circuit of Ohannes et al. addresses this problem. Like the other Miller Killers described, the PDMK functions by providing a switchable shunt to GND for the pulldown transistor's control node. The shunt is an MK transistor which is controlled by a voltage signal coming into the local buffer's output node $V_{OUT}$ from the common bus. This is accomplished by coupling the MK transistor's control node to $V_{OUT}$ through an MK-transistor-driver transistor. This driver transistor is coupled into the buffer in such a way that it can conduct when and only when the local buffer is not powered by $V_{CC}$, i.e. when there is little or no potential difference between the local buffer's power rails. Under those circumstances, the signal impressed on $V_{OUT}$ of the local buffer by the bus will end up at the control node of the MK transistor—which will then turn on and divert Miller Current from the control node of the pulldown transistor to GND. The "PD" in PDMK refers not to the Miller Killer circuit directly but rather to the state of the local buffer when this circuit provides Miller Current protection, i.e., only during the period that the local buffer is powered down.

The prior art and its limitations with respect to providing Miller Current protection during an L→Z transition can be understood with reference to FIG. 1 (Prior Art), which depicts the relevant parts of a standard tristate output buffer circuit coupled between a high-potential power rail $V_{CC}$ and a low-potential power rail GND. This buffer has built into it a DCMK—consisting in principal part of the transistor QN1—similar in principle to that of Ferris, and provided to guard the pulldown transistors Q4A and Q4B (collectively, "Q4") when $V_{OUT}$ is forced high by an L→H transition of the common bus while the buffer is disabled (in the Z state). The buffer is enabled or disabled by the signals applied at the complementary inputs E and EB. More specifically, the buffer of FIG. 1 is enabled when a logic-low voltage is applied at E and logic-high at EB; it is disabled by the reverse—i.e., logic-high at E and logic-low at EB. The E and EB are complementary inputs originating from a single input at ENB (FIG. 1A). Thus, a logic-high signal at ENB passes through a first inverter to produce a logic-low signal at EB and, after passing through a second inverter, produces a logic-high signal at E (and conversely for a logic low signal at ENB).

Note that E is coupled to each of the control nodes of the three PMOS transistors QP9, QP6, and QP3. A logic-low voltage at E ensures that these three transistors are conducting and that the buffer is able to be of either the active-low or active-high state (depending on the input at $V_{IN}$). I.e., QP3 couples $V_{CC}$ through resistance R2 to the base node of bipolar transistor Q3A and to the drain node of the NMOS transistor QN2, the bulk of which is tied to GND and the control gate of which is coupled directly to $V_{IN}$. With $V_{IN}$ logic-high, QN2 is turned on. This provides base drive current to the pulldown transistor Q4, which then sinks current from the bus through $V_{OUT}$. It also causes the potential at the base node of Q3A to drop (because of the IR drop across R2) so that that transistor is turned off. With Q3A off, Q3B receives no base drive and is then turned off as well, halting the output buffer's current sourcing to the bus. Conversely, when $V_{IN}$ is logic-low, the NMOS transistor QN2 is turned off, depriving the pulldown transistor Q4 of base drive and hence turning off the output buffer's current-sinking circuitry. Concurrently, this turn-off of QN2 boosts the voltage at the control node of Q3A so as to turn that transistor on, providing base drive for Q3B and hence current-sourcing to the common bus through $V_{OUT}$. Note that whether the buffer is current-sinking or current-sourcing, the NMOS transistor QN1 (the DCMK transistor) is non-conducting and maintained in that state by the logic-low voltage placed on its control node by E.

A logic-high signal at the enable buffer input ENB causes a logic-high signal at E, disabling the output buffer, i.e., putting it into its Z state. This follows since the logic-high voltage at E turns off the three PMOS transistors QP9, QP6, and QP3—depriving the first pullup transistor of any source of base drive regardless of the input at $V_{IN}$. This ensures that the current-sourcing circuit remains off and simply presents a high DC impedance to the bus at $V_{OUT}$ (i.e., between $V_{OUT}$ and GND). The logic-high disabling signal at E is coupled into the control node of this NMOS transistor QN1, causing QN1 to conduct and so to clamp the control node of the pulldown transistor Q4 to GND; this guards Q4, preventing it from being turned on by any spurious base voltages. For purposes of this discussion, we will be primarily interested in the L state and the Z state, to be described below.

As shown, when the buffer is in its Z state QN1 is conducting and clamps the base of pulldown transistor Q4 to GND. Thus, when $V_{OUT}$ is forced high by a L→H transition of the bus, the spike of capacitive current passing through the Schottky diode of Q4 and appearing at the base of Q4 has a short path to GND through QN1 and does not provide base current for Q4. Furthermore, the low impedance path provided between the base of Q4 and GND means that the RC time constant associated with charging the collector/base junction when $V_{OUT}$ is forced high is minimized. In this way the MK transistor QN1 performs its function by preventing an unwanted turn-on which—when repeated in all of the inactive buffers coupled to the bus—can seriously load down the bus as well as delay the completion of the L→H transition of the bus. The net result is that the switching time of the common bus is not degraded by the plurality of inactive buffers coupled to the bus. Again, it is noted that QN1 is referred to as a DC Miller Killer because it is continuously in operation as long as the buffer in inactive; it is not coupled to the L→H transient on the bus.

Although QN1 acts as a DCMK while the buffer is in the Z state, it is not fast enough to handle parasitic current during the output buffer's transition to that state from the low-active state, i.e., during the L→Z transition. QN1 as it exists in the traditional tristate output buffer does not have a sufficiently low impedance in its conducting state to discharge the Q4 base quickly enough to meet ever-increasing speed demands on such circuitry. Although it might be thought that a quick fix would be to simply enlarge—and thus reduce the impedance of—QN1, which is already in place, this does not work; the concomitant increase in QN1's capacitance loads down the enable input E, thereby prolonging the enable/disable propagation times for the buffer. (Less importantly, but still militating against enlarging QN1, are the demands on circuit layout area which enlarging the planar NMOS device QN1 impose.) A more fundamental propagation time problem is that QN1 is turned on by E, which signal is already delayed—with respect to the enable buffer input signal ENB—by the time required for the signal to transit two inverters (refer to the enable buffer schematic in the lower left corner of FIG. 1). This is twice the delay of the EB signal, which is pulled off the enable buffer after a single inverter. In other words, QN1 turns on relatively late in the game compared to the switching of other elements in the output buffer during the L→Z transition.

What is needed therefore is a Miller Killer circuit which will furnish a low-impedance path to ground for the control nodes of the pulldown transistors early in the L→Z transition and then will maintain that path up to but not past the time the DCMK comes on. What is also needed is such a Miller Killer circuit which will not load down the enable buffer circuit and will not require significant layout area.

SUMMARY OF THE INVENTION

The present invention suppresses parasitic Miller Current occurring during an L→Z transition of a tristate output buffer without compromising the buffer's DCMK circuit. Furthermore, the present Miller Killer circuit is coupled to the enable buffer input in such a way that it provides a low-impedance path to ground for the base of the output buffer's pulldown transistor just during the switching transient associated with the L→Z transition of the output buffer. Still further, the preferred embodiment of the present invention incorporates a bipolar transistor as its MK transistor, thus minimizing demands on scarce chip space. Finally, by releasing the DCMK from any need to deal with the L→Z transient, the present invention allows the DCMK transistor to be reduced in size, a change which provides an incidental speed-up in the Z→L transition as well.

The present invention takes advantage of the time window provided by the inverter-caused delay between the low-to-high switching of E and the associated high-to-low switching of EB following a low-to-high switch in the ENB input. This is done in the preferred embodiment by establishing a series connection between the control node of the new MK transistor and the high-potential power rail $V_{CC}$ through two, one of which is controlled by E and the other of which by EB (E's complementary input). Thus, during the steady-state, when the output buffer is either enabled or disabled and the E and EB inputs are of mutually opposite logic, this MK transistor will never be on. Only during the short interval that E and EB are logic-low will the two series PMOS transistors both be on; thus it is only during this time window that the MK transistor used in this invention (the LZ/ACMK circuit) will receive base drive and hence clamp the pulldown transistor's control node sufficiently close to GND (specifically, at $V_{SAT}$, approximately 0.3V) to ensure that the pulldown transistor is kept off.

The main advantage of the LZ/ACMK circuit is the reduction of the propagation time for the L→Z transition of the output buffer. The shortened propagation time results from three factors.

A) A lower impedance discharge path is used to shut off the pulldown transistors than was provided previously by the NMOS transistor coupling its base to GND; the approach using a small bipolar transistor (Q1) is far more practicable than that of enlarging the DCMK transistor (QN1);

B) The activation signal to the new AC Miller Killer transistor (Q1) is generated one inverter sooner from the Enable Buffer than is the case for the DCMK transistor (QN1), thus further reducing the delay between the ENB input and the turning off of the pulldown circuit;

C) Since the DCMK transistor QN1 no longer has to provide double service by acting during the L→Z transistion interval, it can be reduced in size and hence capacitance, thus increasing the speed with which E can switch from logic low to logic high during the disabling transistion;

A secondary advantage arising from the smaller size now permitted for QN1 is that during the inverse transition Z→L QN1 will draw less capacitive current away from the base drive provided to Q4, with the result that the latter will turn on slightly sooner, i.e., the Z→L transition will be accomplished slightly sooner as well.

Applicants have carried out various speed comparisons between the prior art—with the relatively large areas then required for the DCMK transistor (QN1), and the preferred embodiment of the present invention—containing LZ/ACMK transistor Q1 and a smaller area for the DCMK transistor (QN1). Comparisons were made between the old and new circuits for two output buffer transitions: L→Z and Z→L. Comparisons were done at 175° C. and $V_{cc}=4.5$ volts. The times measured were the respective delays—in nanoseconds—between a signal input to said enable buffer input ENB and the appearance of the corresponding signal at the output of the output buffer, with the input $V_{IN}$ to the output buffer set to provide a logic-low buffer state. The results are shown in Table 1 below.

TABLE I

| | Comparison of Propagation Delays | |
|---|---|---|
| | L→Z Transition | Z→L Transition |
| Prior Art | 7.5 ns | 11.3 ns |
| New Invention (Preferred embodiment) | 5.5 ns | 11.1 ns |

In its preferred embodiment, the present invention shields bipolar output pulldown transistors of a particular tristate BiCMOS output buffer from Miller Current. Nevertheless, the present LZ/ACMK has applicability to a broad range of tristate output buffers, including those utilizing field effect transistors in their output pulldown circuits. Furthermore, although the preferred embodiment of this invention utilizes a pair of PMOS transistors in series to control the Miller Killer transistor, other methods of providing a transient turn-on of the MK transistor will readily occur to those skilled in the art. The present LZ/ACMK invention therefore includes a broad range of methods for achieving transient turn-on control for its Miller Killer transistor.

PREFERRED EMBODIMENT OF THE INVENTION

Figure 2:
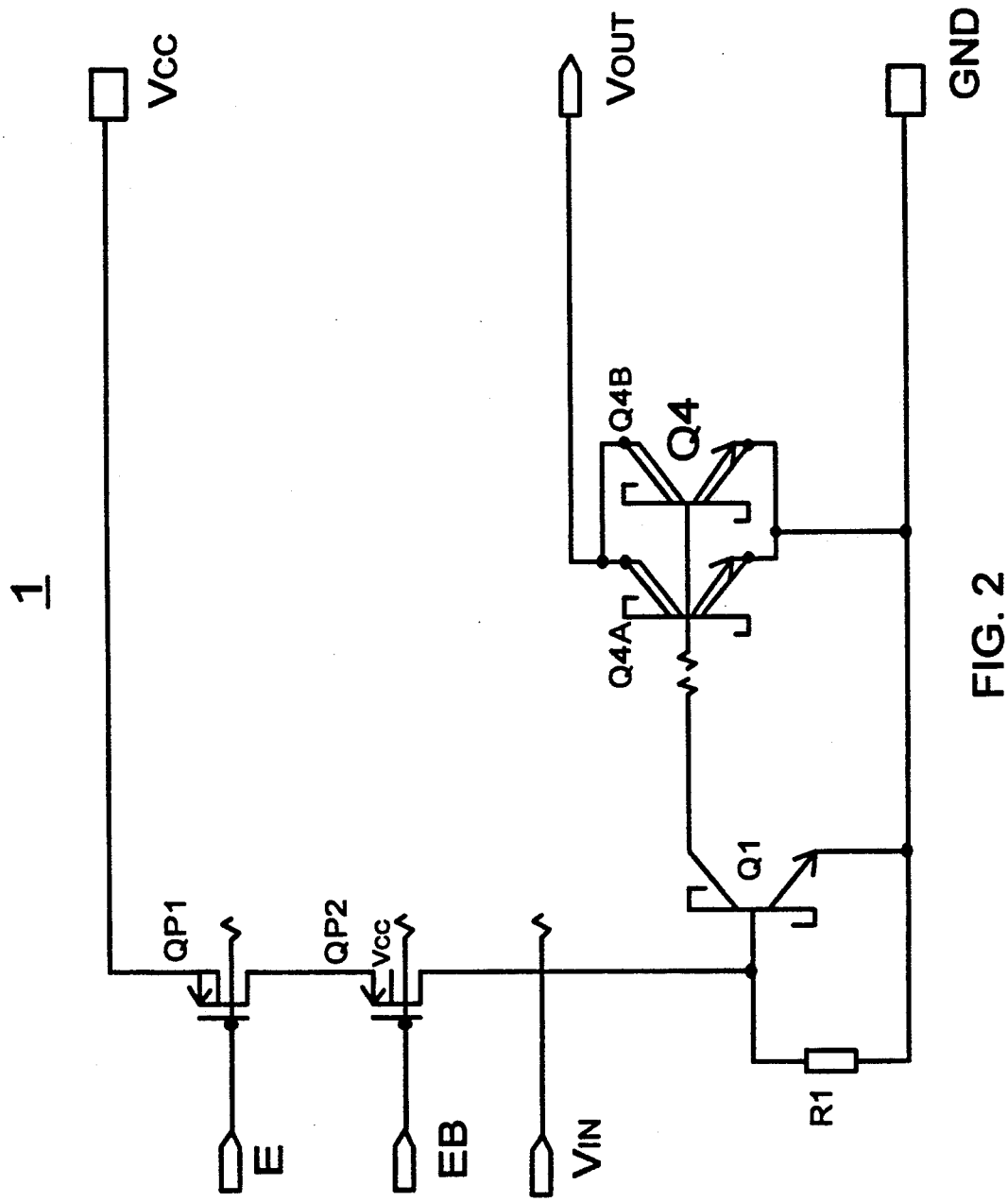
FIG. 2 shows the preferred embodiment of the present invention in semi-isolation, i.e., coupled to an enable buffer circuit, power rails, and a pulldown transistor but not incorporated into a complete output buffer circuit.
Figure 3:
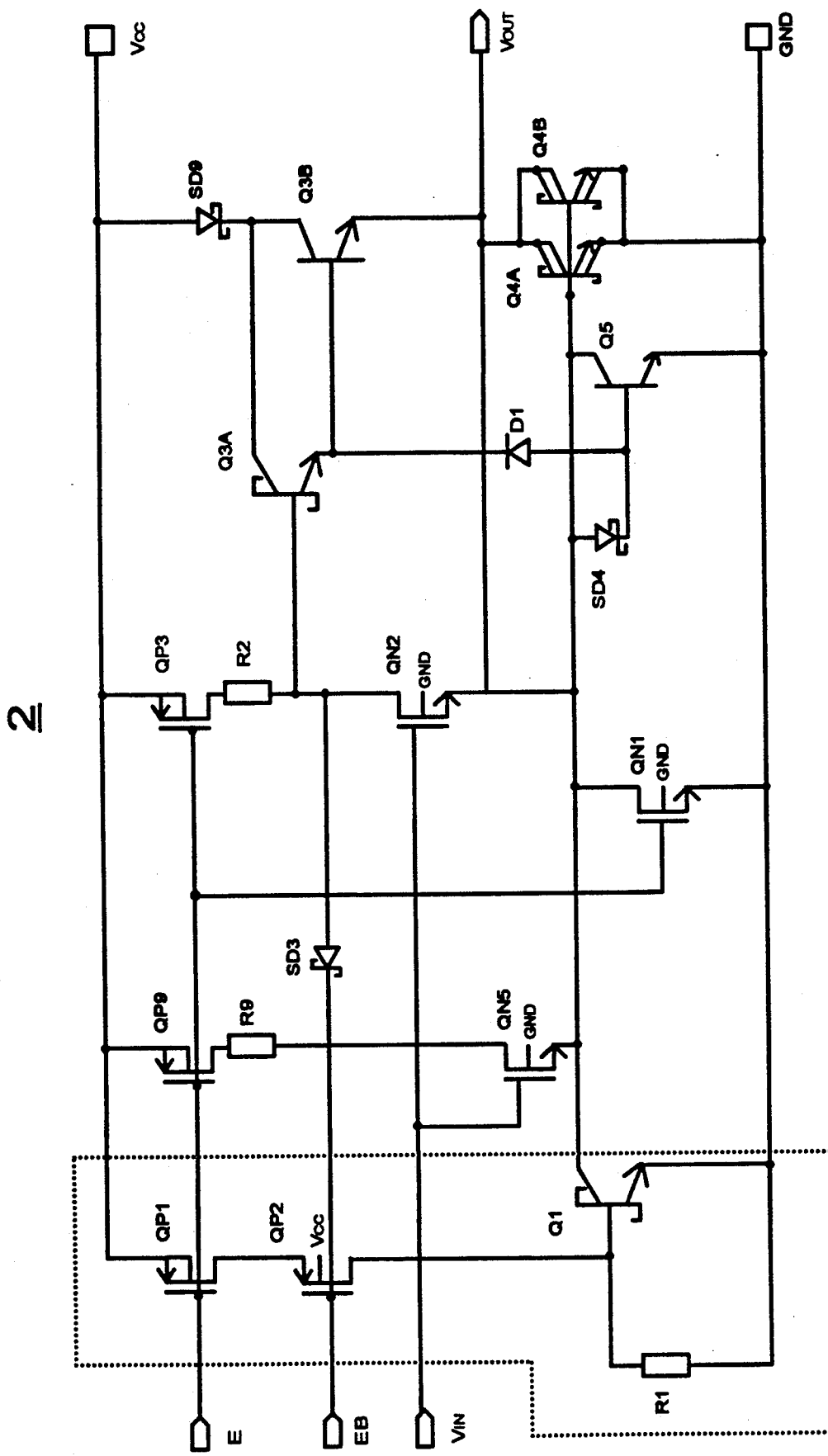
FIG. 3 shows the preferred embodiment of the present invention (dashed box) incorporated into a particular tristate output buffer—the same shown in FIG. 1.

FIG. 2 shows the preferred embodiment 1 of the present invention in semi-isolation and FIG. 3 shows said preferred embodiment (inside box) incorporated into a tristate output buffer 2. Said preferred embodiment 1 comprises a bipolar LZ/ACMK transistor Q1, an LZ/ACMK transistor base discharge resistor R1, and an upper control transistor QP1 coupled in series to a lower control transistor QP2. (In the preferred embodiment both said upper control transistor QP1 and said lower control transistor QP2 are PMOS transistors.) A gate node of said upper control transistor QP1 is coupled to enable input E and a gate node of said lower control transistor QP2 is coupled to a complementary enable input EB. With continuing reference to FIG. 2 and FIG. 3, it can be seen that a source node of said upper control transistor QP1 is coupled to a high-potential power rail $V_{cc}$ and a drain node of said lower control transistor QP2 is coupled to a base node of said LZ/ACMK transistor Q1. Restated, said base node of said LZ/ACMK transistor Q1 is coupled to said high potential power rail $V_{cc}$ through said upper control transistor QP1 in series with said lower control transistor QP2. In operation, said LZ/ACMK transistor Q1 is coupled between a base of a pulldown transistor Q4 of said output buffer 2 and a low-potential power rail GND. Thus, when said LZ/ACMK transistor Q1 receives base drive, said base of said pulldown transistor Q4 will be connected to said lower base rail GND and hence said pulldown transistor Q4 will be turned off.

Figures 1, 1A:
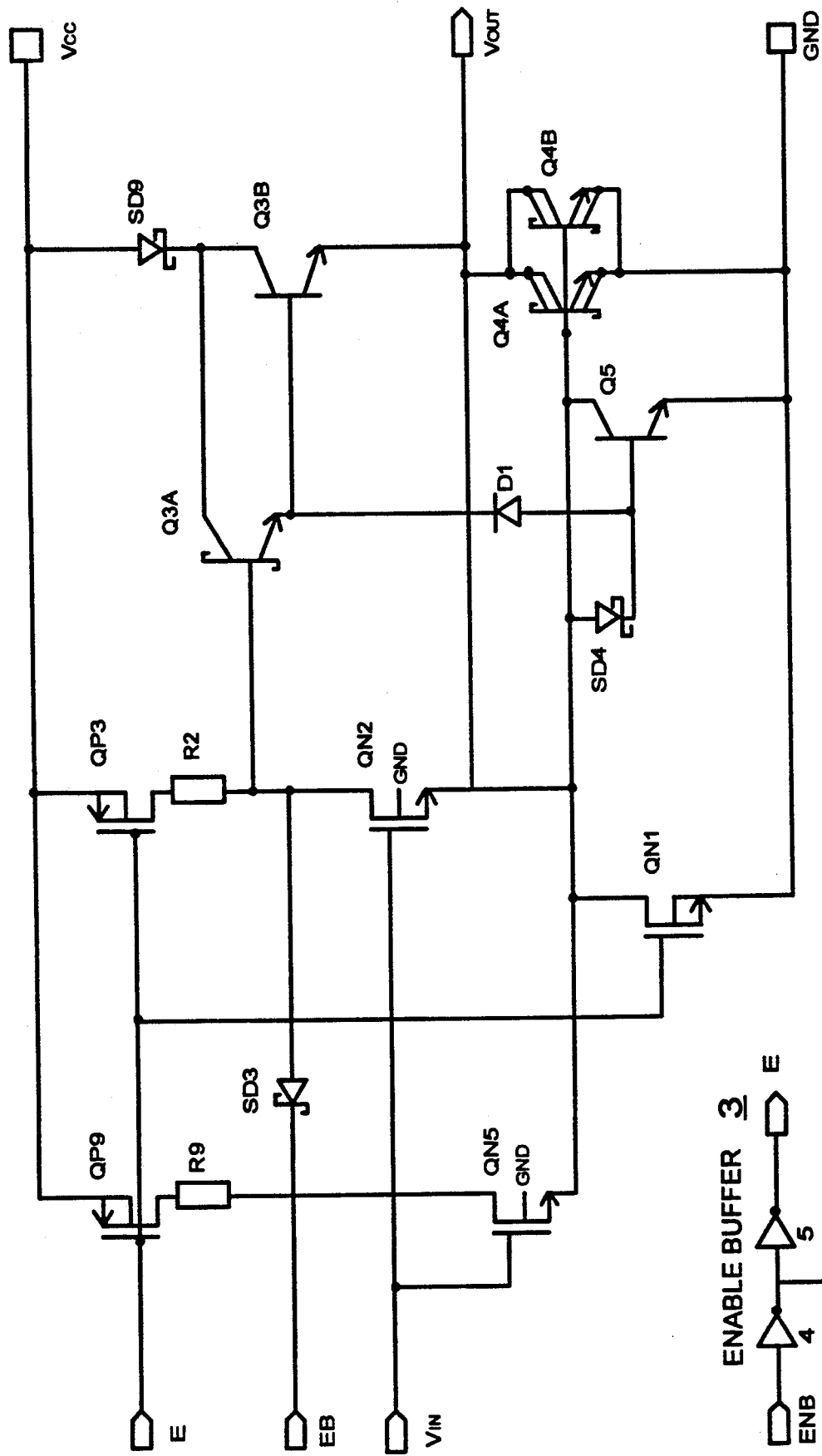
FIG. 1 is a schematic diagram of a standard tristate output buffer circuit with an inset (FIG. 1A) showing the enable buffer circuit the output signals from which are normally fed into the complementary outputs, E and EB, of the tristate output buffer. (Prior Art.)

In order for said LZ/ACMK transistor Q1 to receive base drive current, both said upper control transistor QP1 and said lower control transistor QP2 must be conducting. This is the case when and only when said enable input E is at logic-low and said complementary enable input EB is at logic-low. This is clearly a transient situation; in steady state operation, said enable input E is always at the opposite logic level from said complementary enable input EB—both being generated by an enable buffer circuit 3 shown schematically in FIG. 1A. Said enable input E is powered through a first inverter 4 in series with a second inverter 5 by an enable buffer input ENB. Thus, when a logic-high signal is applied to said enable buffer input ENB, a logic-low signal will appear at said complementary enable input EB, though only after the delay $\tau$ required for signal propagation through said first inverter 4. Similarly, a logic-high signal will subsequently appear at said enable input E, after the additional delay $\tau$ required for signal propagation through said second inverter 5. Said enable input E will be either at logic-high or at logic-low (disregarding the time—normally short compared to the intervals of interest here—required to actually switch between logic-low and logic-high once the control signal has arrived). Thus, when said enable buffer input ENB is switched from logic-low to logic-high there will be an interval $\tau$ equal to the time required for a signal to propagate through said second inverter 5 that said enable input E will still be logic-low and said complementary enable input EB will already have switched to logic low. It is during this interval $\tau$ that both said upper control transistor QP1 said lower transistor QP2 will be turned on, fulfilling the condition necessary for said LZ/ACMK transistor Q1 to receive base drive current. During this interval, said LZ/ACMK transistor Q1 is conducting and pulls said base of said pulldown transistor Q4 to a voltage $V_{SAT}$ (nominally 0.3 volt) above ground—sufficiently low to ensure the turn-off of said pulldown transistor Q4. Note that at all times, said base of said LZ/ACMK transistor Q1 is coupled directly to said low-potential power rail GND through said base discharge resistor R1. For the circuit depicted in FIG. 2 and FIG. 3, said base discharge resistor R1 has a nominal resistance of 20,000 Ω. Since this is very large compared to the dc impedance of said upper control transistor QP1 in series with said lower control transistor QP2, base drive is assured to said base of said LZ/ACMK transistor as long as said upper control transistor QP1 and said lower control transistor QP2 are conducting and said enable input E is logic-low—in spite of the resistive link of said base of said LZ/ACMK transistor Q1 to said low-potential power rail GND.

At the conclusion of the disable transient, approximately $2\tau$ after a high-logic signal has been applied to said enable buffer input ENB, said enable input E switches to logic-high, switching off said upper control transistor QP1, thereby depriving said LZ/ACMK transistor Q1 of base drive current. When this happens, said base discharge resistor R1 discharges said base of said LZ/ACMK transistor Q1 and thereafter—and until a next transition of said output buffer into its inactive state Z—clamps said base of said LZ/ACMK transistor Q1 to said low-potential power rail GND, usually at ground potential. In this manner, said LZ/ACMK transistor Q1 is held "off" except during a transition of said output buffer into its Z state.

FIG. 3 demonstrates the manner in which the operation of said LZ/ACMK transistor Q1 dovetails with that of a DCMK transistor QN1. At the conclusion of the transient during which said LZ/ACMK transistor Q1 is conducting and thereby pulling said base of said pulldown transistor Q4, said enable input E—coupled to a control gate node of said DCMK transistor QN1—becomes logic-high, thereby turning on said DCMK transistor QN1, which in turn is able to clamp said base of said pulldown transistor Q4 to said low potential ground rail GND for the duration of the period that said output buffer circuit 2 is in its disabled Z state. Because of the Miller Current protection provided by LZ/ACMK transistor Q1, it is now possible to reduce said DCMK transistor QN1 in area, thus reducing capacitive loading on said enable input E and hence increasing switching speed for changes of said enable input E from logic-low to logic-high, as demonstrated by experimental results reported in SUMMARY OF THE INVENTION.

We claim:

1. An LZ/AC Miller Killer circuit for guarding an output pulldown transistor of a tristate output buffer while said output buffer is being switched from an active state to an inactive state by an enable buffer circuit having an input ENB, an enable output E, and a complementary enable output EB, said Miller Killer circuit comprising,
   (a) a Miller-Killer transistor;
   (b) a Miller-Killer-transistor control link;
   (c) a Miller-Killer-transistor suppressor;
wherein a control node of said Miller-Killer transistor is connected to a high-potential power rail $V_{cc}$ through said control link, said Miller-Killer-transistor suppressor couples said control node of said Miller-Killer transistor to a low potential power rail GND, and said Miller-Killer transistor is connected between a control node of said output pulldown transistor and said low-potential power rail GND and wherein said control link is couplable to said enable buffer circuit so that said control link comprises a low impedance connection between said high-potential power rail $V_{cc}$ and said control node of said Miller Killer transistor when and only when said enable buffer is switching said tristate output buffer from said active state to said inactive state, and where said Miller-Killer-transistor suppressor is coupled to said output buffer circuit so as to ensure that said Miller-Killer transistor is not conducting except when said control link comprises said low-impedance connection between said high-potential power rail $V_{cc}$ and said control node of said Miller-Killer transistor.

2. An LZ/AC Miller Killer circuit as described in claim 1 wherein said control link comprises a first control transistor coupled in series to a second control transistor, wherein a control node of said first control transistor is connected directly to said enable output E of said enable buffer circuit and a control node of said second control transistor is connected directly to said complementary enable output EB.

3. An LZ/AC Miller Killer circuit as described in claim 2 where said Miller Killer transistor is a bipolar transistor, said first control transistor is a PMOS transistor, and said second control transistor is a PMOS transistor.

4. An LZ/AC Miller Killer circuit as described in claim 3 where said Miller-Killer-transistor suppressor is a resistor (R1) one end of which is coupled directly to a base node of said LZ/AC Miller Killer circuit and the other end of which is coupled to said low-potential power rail GND of said output buffer circuit.

5. A Miller Killer improvement in a tristate output buffer for delivering output signals of high-logic and low-logic levels at an output $V_{OUT}$ in response to data signals at an input $V_{IN}$, said tristate output buffer comprising
   (a) a pulldown transistor having a primary current path between said output $V_{OUT}$ and a low-potential power rail GND,
   (b) a pulldown-driver transistor coupled between a high-potential power rail $V_{CC}$ and a control node of said pulldown transistor wherein a control node of said pulldown-driver transistor is connected directly to said input $V_{IN}$,
wherein said tristate output buffer is switchable between an active mode and an inactive mode by an enable buffer circuit coupled to said tristate output buffer, said Miller Killer improvement being a circuit for diverting and discharging Miller Current from said control node of said pulldown transistor when and only when said tristate output buffer is being switched between said active mode and said inactive mode, said Miller Killer improvement comprising
   (a) an LZ/ACMK transistor having primary current path between said control node of said pulldown transistor and said low-potential power rail GND,
   (b) an LZ/ACMK-transistor control link coupling said high-potential power rail $V_{CC}$ to a control node of said LZ/ACMK transistor;
   (c) an LZ/ACMK-transistor suppressor coupling said control node of said LZ/ACMK transistor to said low-potential power rail GND,
wherein said control link comprises a low impedance path when and only when said tristate output buffer is being switched from said active mode to said inactive mode by said enable buffer and wherein said LZ/ACMK-transistor suppressor ensures that said LZ/ACMK transistor will be turned off at all times except when said tristate output buffer is being switched from said active mode to said inactive mode.

6. A Miller-Killer improvement as described in claim 5 wherein said control link comprises a first control transistor in series with a second control transistor and wherein a control node of said first control transistor is coupled directly to said enable output E of said enable buffer circuit and a control node of second control transistor is coupled directly to said complementary enable output EB of said enable buffer.

7. A Miller-Killer improvement as described in claim 6 wherein said first control transistor is a PMOS transistor and said second control transistor is a PMOS transistor.

8. A Miller-Killer improvement as described in claim 7 wherein said LZ/ACMK-transitor suppressor comprises a resistor having a dc resistance selected to ensure that said LZ/ACMK transistor remains turned on during the period that said first control transistor and said second control transistor are both conducting.

9. A Miller-Killer improvement as described in claim 8 wherein said LZ/ACMK transistor is a bipolar transistor.

10. A Miller Killer improvement as described in claim 5 wherein said tristate output buffer is a BiCMOS circuit, said pulldown transistor is a bipolar transistor, said pulldown-driver transistor is an NMOS transistor, said LZ/ACMK transistor is a bipolar transistor, and said variable impedance control link comprises an upper PMOS control transistor in series with a lower PMOS control transistor, and said LZ/ACMK transistor suppressor comprises a resistor coupled directly between a base node of said LZ/ACMK transistor and said low-potential power rail GND.

11. A Miller Killer improvement for a BiCMOS tristate output buffer for delivering output signals of high-logic and low-logic levels at an output $V_{OUT}$ in response to data signals at an input $V_{IN}$, comprising
   (a) a relatively high-current-capacity bipolar pulldown transistor (Q4) having a primary current path for sinking current from said output $V_{OUT}$ to a low-potential power rail GND,
   (b) an NMOS pulldown-driver transistor (QN2) coupled between a high-potential power rail $V_{cc}$ and a base node of said bipolar pulldown transistor (Q4) and having a control gate node coupled to said input $V_{IN}$,
wherein said BiCMOS tristate output buffer is switchable between an active mode and an inactive mode by an enable buffer circuit to which said BiCMOS tristate output buffer is coupled, the Miller Killer improvement being a circuit for diverting and discharging Miller Current from said base node of said bipolar pulldown transistor (Q4) and comprising:
   (a) a bipolar LZ/ACMK transistor (Q1) having primary current path between said base node of said bipolar pulldown transistor (Q4) and said low-potential power rail GND,
   (b) an LZ/ACMK-transistor control link coupling a base node of said LZ/ACMK transistor to said high-potential power rail $V_{cc}$;
   (c) an LZ/ACMK-transistor suppressor coupling said control node of said LZ/ACMK transistor to said low-potential power rail GND,
wherein said control link comprises two PMOS transistors in series, namely a first control transistor (QP1) in series with a second control transistor (QP2) and wherein a control gate of said first control transistor (QP1) is connected directly to said enable output E and a control gate of said second control transistor (QP2) is connected directly to said complementary enable output EB, wherein said LZ/ACMK transistor is a bipolar transistor, and said LZ/ACMK-transistor suppressor is a resistor (R1) connected between a base node of said LZ/ACMK transistor and said low-potential power rail GND.

* * * * *